(12) United States Patent
Xu et al.

(10) Patent No.: US 10,141,305 B2
(45) Date of Patent: Nov. 27, 2018

(54) SEMICONDUCTOR DEVICES EMPLOYING FIELD EFFECT TRANSISTORS (FETS) WITH MULTIPLE CHANNEL STRUCTURES WITHOUT SHALLOW TRENCH ISOLATION (STI) VOID-INDUCED ELECTRICAL SHORTS

(71) Applicant: QUALCOMM Incorporated, San Diego, CA (US)

(72) Inventors: Jeffrey Junhao Xu, San Diego, CA (US); Haining Yang, San Diego, CA (US); Jun Yuan, San Diego, CA (US); Kern Rim, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/266,214

(22) Filed: Sep. 15, 2016

(65) Prior Publication Data
US 2018/0076197 A1    Mar. 15, 2018

(51) Int. Cl.
*H01L 27/088* (2006.01)
*H01L 29/06* (2006.01)
(Continued)

(52) U.S. Cl.
CPC ...... *H01L 27/0886* (2013.01); *H01L 21/3081* (2013.01); *H01L 21/30604* (2013.01);
(Continued)

(58) Field of Classification Search
CPC ................. H01L 27/0886; H01L 27/0866
See application file for complete search history.

(56) References Cited

U.S. PATENT DOCUMENTS

| 7,033,945 B2 | 4/2006 | Byun et al. |
| 8,686,516 B2 | 4/2014 | Chen et al. |
| 8,895,446 B2 | 11/2014 | Peng et al. |
| 2010/0044678 A1* | 2/2010 | Afzali-Ardakani .... B82Y 10/00 257/24 |
| 2010/0283108 A1* | 11/2010 | Sawada ............. H01L 21/76229 257/368 |
| 2011/0049669 A1 | 3/2011 | Lee |

(Continued)

OTHER PUBLICATIONS

International Search Report and Written Opinion for PCT/US2017/051505, dated Dec. 1, 2017, 14 pages.
Second Written Opinion for PCT/US2017/051505, dated Aug. 27, 2018, 8 pages.

*Primary Examiner* — Mounir S Amer
(74) *Attorney, Agent, or Firm* — Withrow & Terranova, PLLC

(57) ABSTRACT

Semiconductor devices employing Field Effect Transistors (FETs) with multiple channel structures without shallow trench isolation (STI) void-induced electrical shorts are disclosed. In one aspect, a semiconductor device is provided that includes a substrate. The semiconductor device includes channel structures disposed over the substrate, the channel structures corresponding to a FET. An STI trench is formed between each corresponding pair of channel structures. Each STI trench includes a bottom region filled with a lower quality oxide, and a top region filled with a higher quality oxide. The lower quality oxide is susceptible to void formation in the bottom region during particular fabrication steps of the semiconductor device. However, the higher quality oxide is not susceptible to void formation. Thus, the higher quality oxide does not include voids with which a gate may electrically couple to other active components, thus preventing STI void-induced electrical shorts in the semiconductor device.

19 Claims, 13 Drawing Sheets

(51) Int. Cl.
  *H01L 29/10*    (2006.01)
  *H01L 21/8234*  (2006.01)
  *H01L 21/762*   (2006.01)
  *H01L 21/306*   (2006.01)
  *H01L 21/308*   (2006.01)
  *H01L 21/311*   (2006.01)
  *H01L 29/78*    (2006.01)

(52) U.S. Cl.
  CPC .. *H01L 21/31111* (2013.01); *H01L 21/76224* (2013.01); *H01L 21/823431* (2013.01); *H01L 21/823481* (2013.01); *H01L 29/0649* (2013.01); *H01L 29/785* (2013.01)

(56) References Cited

U.S. PATENT DOCUMENTS

| | | |
|---|---|---|
| 2011/0095378 A1* | 4/2011 | Lee .................. H01L 29/41791 257/401 |
| 2014/0042491 A1 | 2/2014 | Chen et al. |
| 2014/0227858 A1 | 8/2014 | Shen et al. |
| 2014/0353795 A1 | 12/2014 | Tong et al. |
| 2015/0014807 A1* | 1/2015 | Chuang ............... H01L 29/0649 257/506 |
| 2015/0340503 A1 | 11/2015 | Minari et al. |
| 2016/0148935 A1* | 5/2016 | Chen ............... H01L 21/823878 257/369 |

* cited by examiner

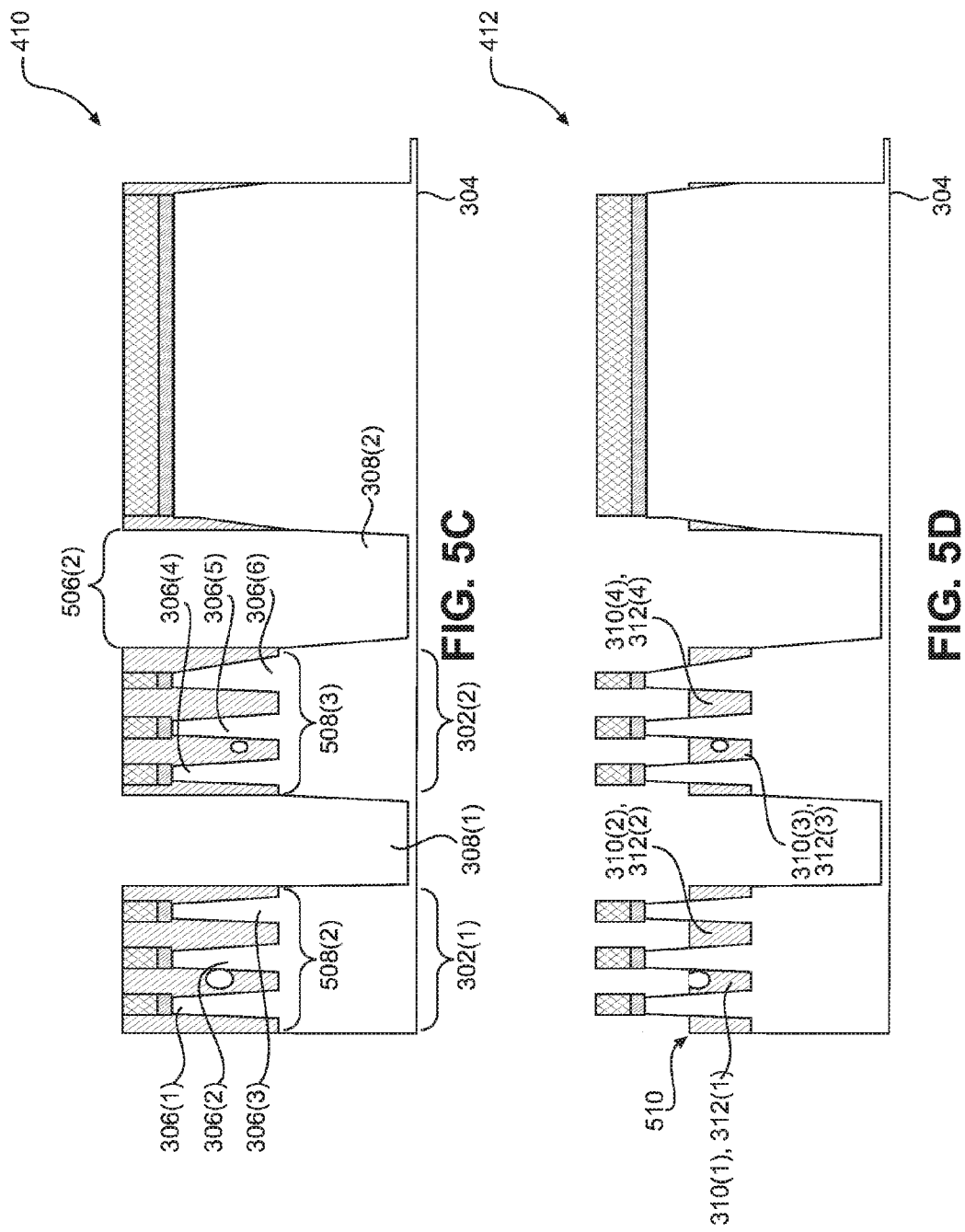

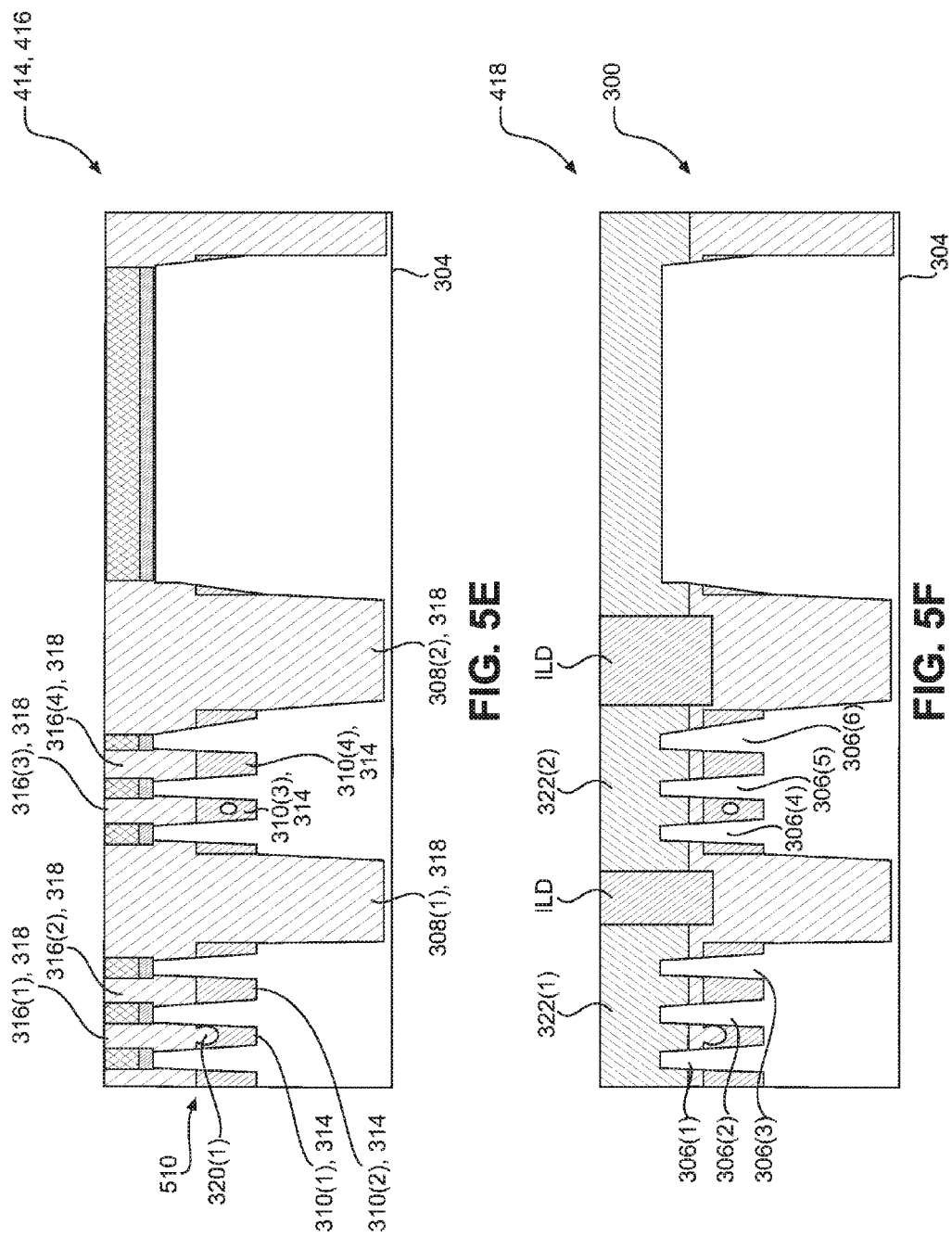

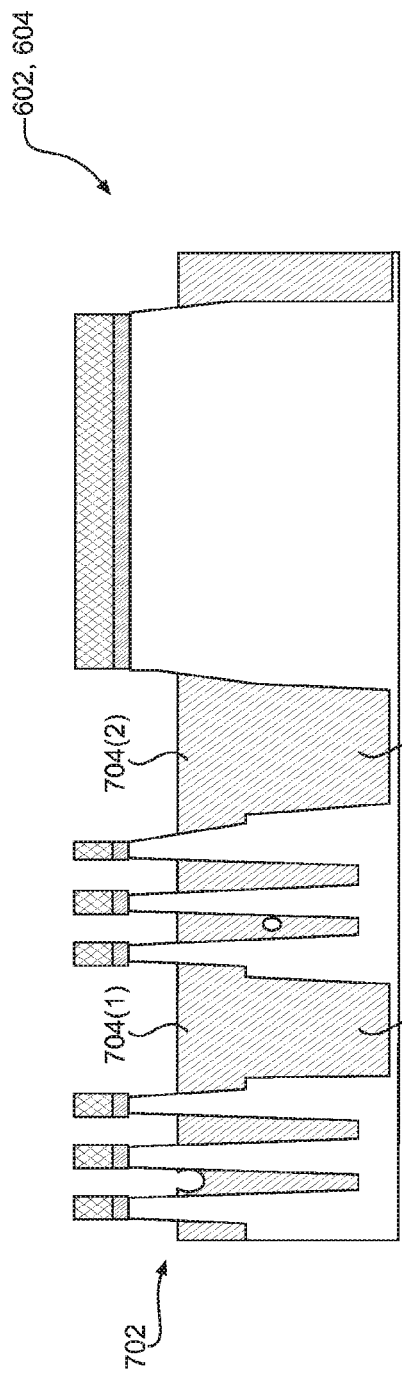
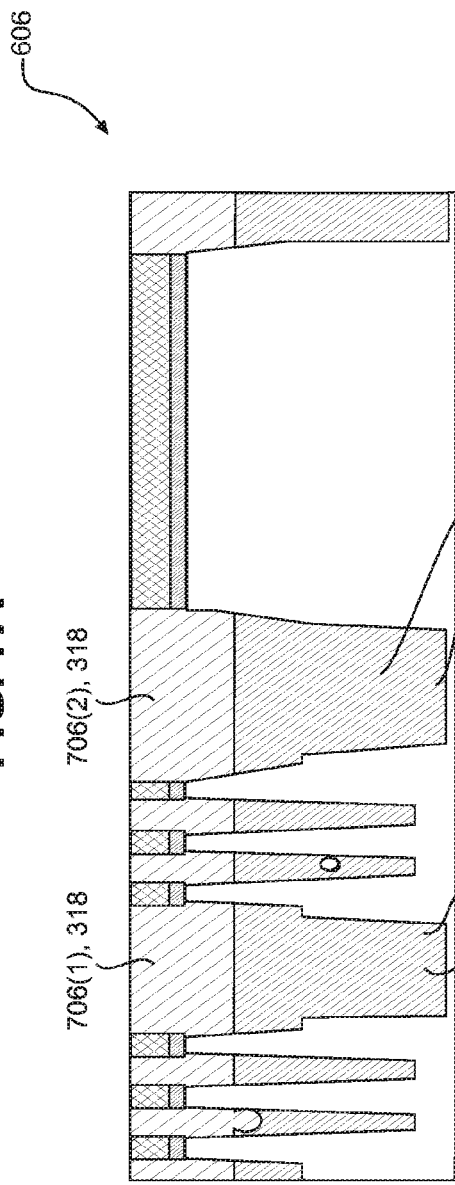

SEMICONDUCTOR DEVICES EMPLOYING FIELD EFFECT TRANSISTORS (FETS) WITH MULTIPLE CHANNEL STRUCTURES WITHOUT SHALLOW TRENCH ISOLATION (STI) VOID-INDUCED ELECTRICAL SHORTS

BACKGROUND

I. Field of the Disclosure

The technology of the disclosure relates generally to semiconductor devices employing shallow trench isolation (STI), and particularly to avoiding STI void-induced electrical shorts in semiconductor devices.

II. Background

As electronic devices become more complex in functionality, so does the need to include a greater number of transistors in such devices. However, as electronic devices are required to be provided in increasingly smaller packages, such as in mobile devices, for example, there is a need to provide a greater number of transistors in a smaller integrated circuit (IC) chip. This increase in the number of transistors is achieved in part through continued efforts to miniaturize transistors in ICs (i.e., placing increasingly more transistors into the same amount of space). In particular, node sizes in ICs are being scaled down by a reduction in minimum metal line width in the ICs (e.g., 65 nanometers (nm), 45 nm, 28 nm, 20 nm, etc.). As a result, the gate lengths of planar transistors are also scalably reduced, thereby reducing the channel length of the planar transistors and interconnects. Reduced channel length in planar transistors has the benefit of increasing drive strength (i.e., increased drain current) and providing smaller parasitic capacitances resulting in reduced circuit delay. However, as channel length in planar transistors is reduced such that the channel length approaches a magnitude similar to the depletion layer widths, short channel effects (SCEs) can occur that degrade performance. More specifically, SCEs in planar transistors cause increased current leakage, reduced threshold voltage, and/or threshold voltage roll-off (i.e., reduced threshold voltage at shorter gate lengths).

In this regard, to address the need to scale down channel lengths in planar transistors while avoiding or mitigating SCEs, transistor designs alternative to planar transistors have been developed. One such alternative transistor design includes a Fin field-effect transistor (FET) (FinFET) that provides a conducting channel via a "Fin" formed from a substrate. Material is wrapped around the Fin to form the gate of the device. For example, FIG. 1 illustrates an exemplary FinFET 100. The FinFET 100 includes a semiconductor substrate 102 and a Fin 104 formed from the semiconductor substrate 102. An oxide layer 106 is included on either side of the Fin 104. The FinFET 100 includes a source 108 and a drain 110 interconnected by the Fin 104 such that an interior portion of the Fin 104 serves as a channel 112 between the source 108 and the drain 110. The Fin 104 is surrounded by a "wrap-around" gate 114. The wrap-around structure of the gate 114 provides better electrostatic control over the channel 112, and thus helps reduce the leakage current and overcome other SCEs.

To achieve even greater electrostatic control over the channel of a FinFET, FinFETs can be designed to include multiple Fins corresponding to a single gate. Each Fin in such a FinFET is electrically isolated from neighboring Fins using a shallow trench isolation (STI) trench filled with a non-conductive material, such as an oxide, for example. However, as Fin pitch is scaled down to reduce area of the FinFET, the distance between each Fin also decreases. The decreased distance between each Fin reduces the width of each STI trench, which increases the height-to-width ratio (e.g., aspect ratio) of each STI trench. Due to the properties of the oxide used to fill an STI trench, conventional fabrication steps, such as annealing the oxide, cause voids to form in the STI trench. Voids can form close enough to a gate employed in the FinFET so that conductive material used to form the gate fills the voids, creating an electrical short between a source and drain of the FinFET. Electrically shorting the drain and source of a FinFET in this manner causes the FinFET to produce erroneous output.

SUMMARY OF THE DISCLOSURE

Aspects disclosed herein include semiconductor devices employing field effect transistors (FETs) with multiple channel structures without shallow trench isolation (STI) void-induced electrical shorts. In one aspect, a semiconductor device is provided that includes a substrate. The semiconductor device also includes channel structures disposed over the substrate, the channel structures corresponding to a FET. Additionally, the semiconductor device includes an STI trench formed between each corresponding pair of channel structures. Each STI trench includes a bottom region filled with a lower quality oxide, and a top region filled with a higher quality oxide. While the lower quality oxide fills the bottom region of the STI trench, the lower quality oxide is susceptible to void formation in the bottom region during particular fabrication steps of the semiconductor device, such as annealing, for example. In contrast, the higher quality oxide that fills the top region of the STI trench is not susceptible to void formation. In this regard, a gate disposed over the channel structures is also disposed over the top region of each STI trench rather than the bottom region. However, because the higher quality oxide is not susceptible to forming voids, the higher quality oxide does not include voids with which the gate may electrically couple to other active components of the FET, such as a source and drain. In this manner, filling the top region of each STI trench with the higher quality oxide prevents STI void-induced electrical shorts in the semiconductor device.

In this regard in one aspect, a semiconductor device is provided. The semiconductor device comprises a substrate. The semiconductor device also comprises a plurality of channel structures disposed over the substrate and corresponding to a FET. The semiconductor device also comprises one or more STI trenches. Each STI trench is formed between a corresponding pair of channel structures of the plurality of channel structures and comprises a bottom region filled with a lower quality oxide and a top region filled with a higher quality oxide.

In another aspect, a semiconductor device is provided. The semiconductor device comprises a means for providing a substrate. The semiconductor device also comprises a means for providing a plurality of channel structures disposed over the substrate and corresponding to a FET. The semiconductor device also comprises a means for providing one or more STI trenches. Each STI trench is formed between a corresponding pair of channel structures of the plurality of channel structures and comprises a bottom region filled with a lower quality oxide and a top region filled with a higher quality oxide.

In another aspect, a method for manufacturing semiconductor devices employing FETs with multiple channel structures without STI void-induced electrical shorts is provided. The method comprises providing a substrate. The substrate comprises a plurality of channel structures disposed over the substrate, and one or more STI trenches. Each STI trench is formed between a corresponding pair of channel structures of the plurality of channel structures. The method also comprises disposing a lower quality oxide in each STI trench. The method also comprises etching the lower quality oxide in each STI trench to a top level of a bottom region of each STI trench. The method also comprises disposing a higher quality oxide in a top region of each STI trench over the lower quality oxide, wherein the higher quality oxide fills voids formed in the lower quality oxide that are adjacent to the top level of the bottom region.

BRIEF DESCRIPTION OF THE FIGURES

FIGS. 5A-5F are cross-sectional diagrams illustrating the semiconductor device in FIG. 3 at each step in the process of fabrication in FIG. 4;

FIGS. 7A-7C are cross-sectional diagrams illustrating the semiconductor device at each step in the process of fabrication in FIG. 6;

DETAILED DESCRIPTION

Figure 1:
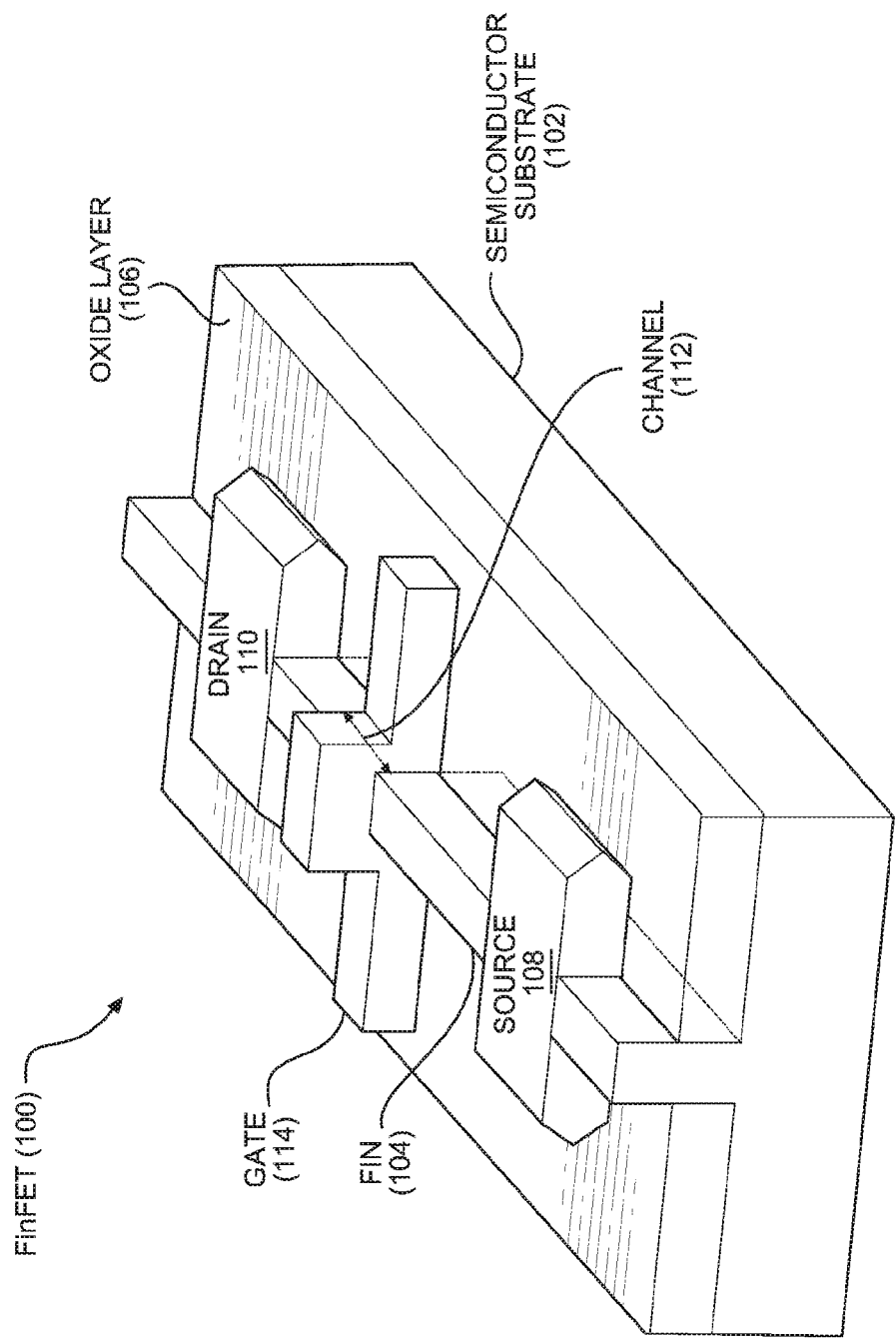
FIG. 1 is a perspective diagram of a conventional Fin Field Effect Transistor (FET) (FinFET)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include semiconductor devices employing field effect transistors (FETs) with multiple channel structures without shallow trench isolation (STI) void-induced electrical shorts. In one aspect, a semiconductor device is provided that includes a substrate. The semiconductor device also includes channel structures disposed over the substrate, the channel structures corresponding to a FET. Additionally, the semiconductor device includes an STI trench formed between each corresponding pair of channel structures. Each STI trench includes a bottom region filled with a lower quality oxide, and a top region filled with a higher quality oxide. While the lower quality oxide fills the bottom region of the STI trench, the lower quality oxide is susceptible to void formation in the bottom region during particular fabrication steps of the semiconductor device, such as annealing, for example. In contrast, the higher quality oxide that fills the top region of the STI trench is not susceptible to void formation. In this regard, a gate disposed over the channel structures is also disposed over the top region of each STI trench rather than the bottom region. However, because the higher quality oxide is not susceptible to forming voids, the higher quality oxide does not include voids with which the gate may electrically couple to other active components, such as a source and drain. In this manner, filling the top region of each STI trench with the higher quality oxide prevents STI void-induced electrical shorts in the semiconductor device.

Figure 2:
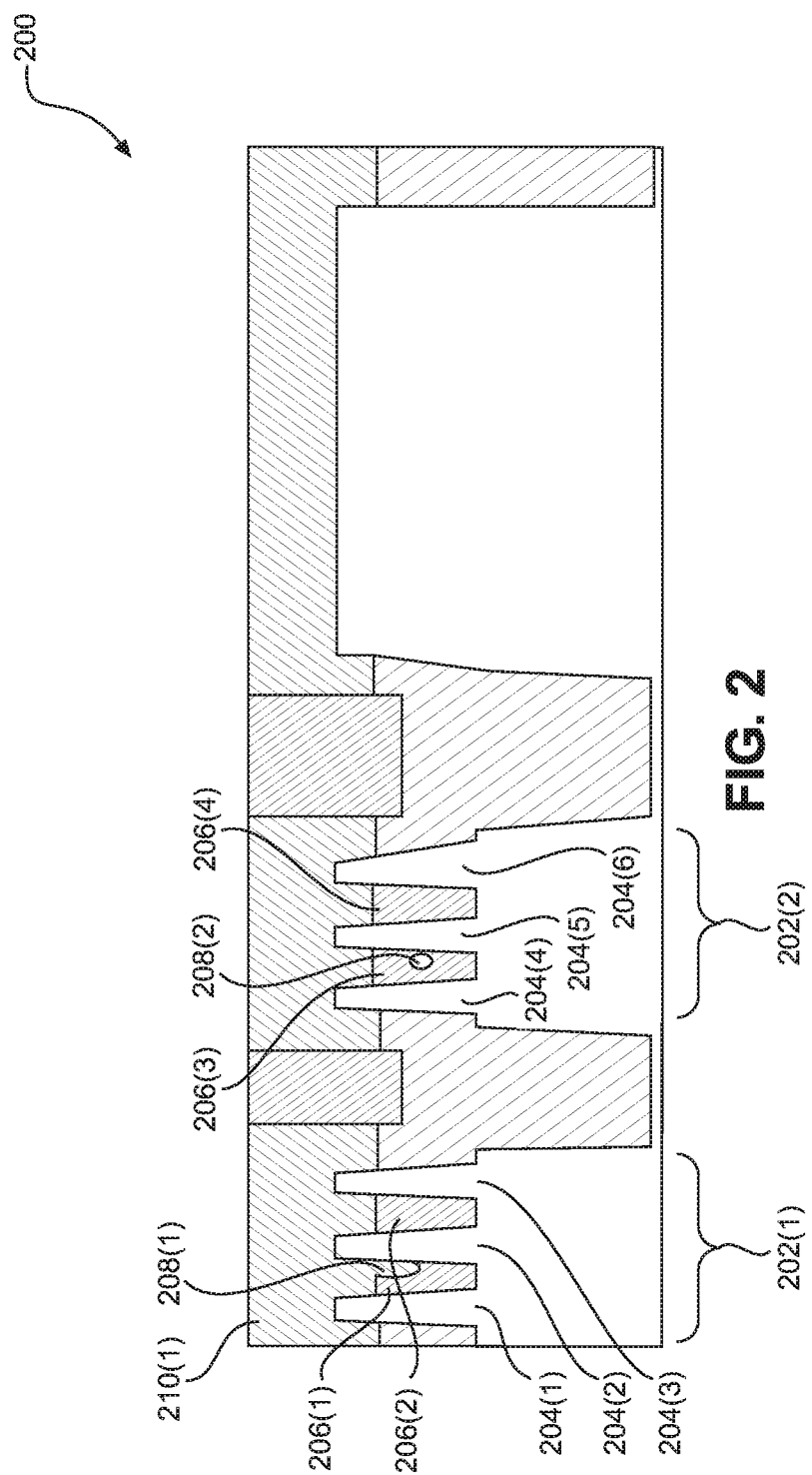
FIG. 2 is a cross-sectional view of an exemplary semiconductor circuit employing FinFETs with shallow trench isolation (STI) void-induced electrical shorts.
Figure 3:
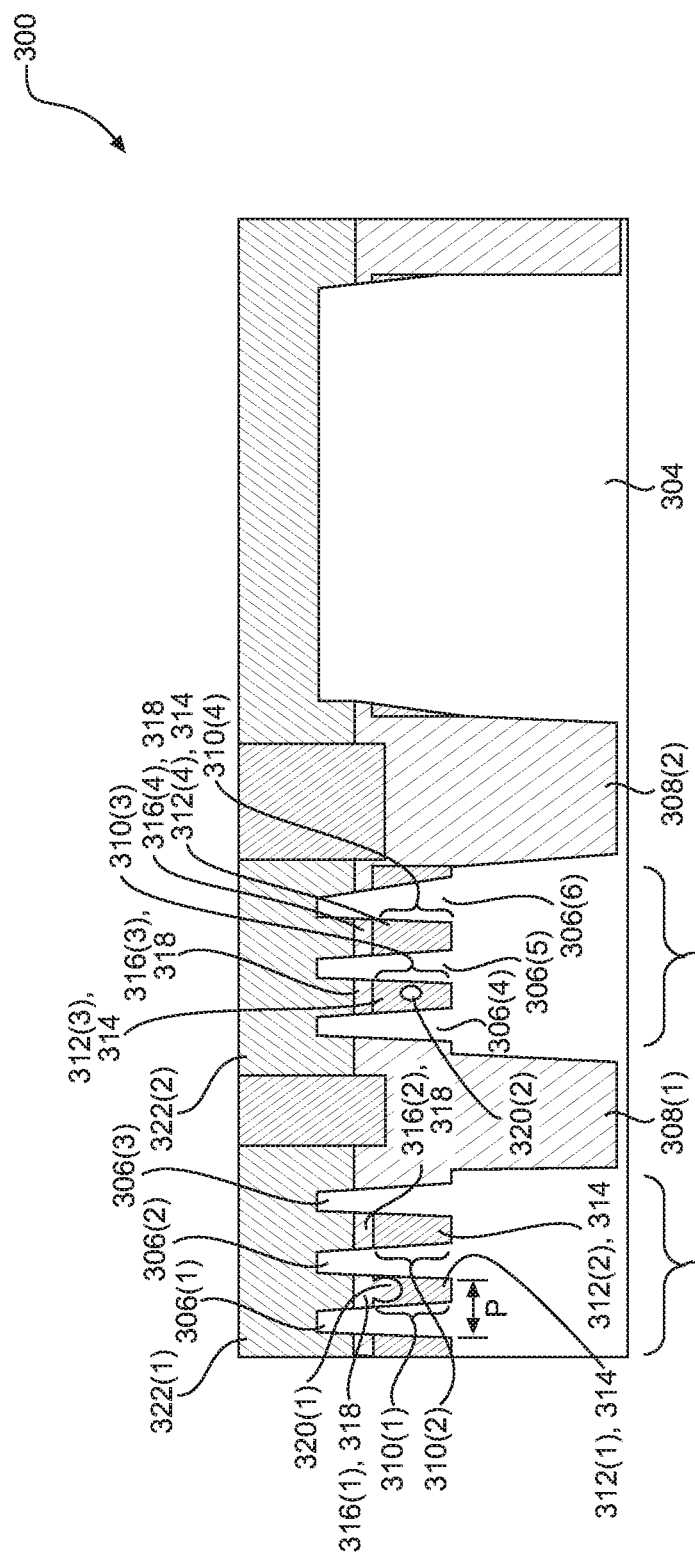
FIG. 3 is a cross-sectional view of an exemplary semiconductor device employing FinFETs without STI void-induced electrical shorts.

Before discussing semiconductor devices employing FETs with multiple channel structures without STI void-induced electrical shorts starting at FIG. 3, exemplary conventional semiconductor devices with STI void-induced electrical shorts are first described. In this regard, FIG. 2 illustrates a semiconductor device 200 that includes first and second FinFETs 202(1), 202(2). The first FinFET 202(1) employs three (3) Fins 204(1)-204(3), and the second FinFET 202(2) employs three (3) Fins 204(4)-204(6). The first FinFET 202(1) includes STI trenches 206(1), 206(2) that electrically isolate Fins 204(1), 204(2) and Fins 204(2), 204(3), respectively. The second FinFET 202(2) includes STI trenches 206(3), 206(4) that electrically isolate Fins 204(4), 204(5) and Fins 204(5), 204(6), respectively. However, as illustrated in FIG. 2, the STI trenches 206(1), 206(3) have voids 208(1), 208(2), respectively, formed in an oxide used to fill the STI trenches 206(1), 206(3). In particular, the void 208(1) is formed close enough in proximity to a gate 210(1) corresponding to the first FinFET 202(1) such that conductive material used to form the gate 210(1) fills the void 208(1), which creates an electrical short between a source and drain (not shown) of the first FinFET 202(1). Electrically shorting the drain and source of the first FinFET 202(1) in this manner causes the first FinFET 202(1) to produce erroneous output.

To prevent such STI void-induced electrical shorts, FIG. 3 illustrates a cross-sectional view of an exemplary semiconductor device 300 employing first and second FETs 302(1), 302(2) without STI void-induced electrical shorts. The semiconductor device 300 includes a substrate 304 on which the first and second FETs 302(1), 302(2) are formed. The first FET 302(1) employs corresponding channel structures 306(1)-306(3) disposed over the substrate 304. Additionally, the second FET 302(2) employs corresponding channel structures 306(4)-306(6) disposed over the substrate 304. In this example, the first and second FETs 302(1), 302(2) are employed as FinFETs, and thus are also referred to herein as first and second FinFETs 302(1), 302(2). In this manner, the channel structures 306(1)-306(6) are also referred to as Fins 306(1)-306(6). However, as discussed in detail below, aspects can employ other types of FETs, such as nanowire FETs, which include alternative channel structures, such as lateral nanowires. Further, as discussed in detail below, a deep STI trench 308(1) is formed between the first and second FinFETs 302(1), 302(2) and configured to electrically isolate the first and second FinFETs 302(1), 302(2). A deep STI trench 308(2) is also formed to electrically isolate the second FinFET 302(2) from other elements in the semiconductor device 300.

With continuing reference to FIG. 3, the semiconductor device 300 also includes STI trenches 310(1)-310(4) formed between each corresponding pair of channel structures 306(1)-306(6). In particular, with reference to the first FinFET 302(1), the STI trench 310(1) is formed between the channel structures 306(1), 306(2), and the STI trench 310(2) is formed between the channel structures 306(2), 306(3). Additionally, with reference to the second FinFET 302(2), the STI trench 310(3) is formed between the channel structures 306(4), 306(5), and the STI trench 310(4) is formed between the channel structures 306(5), 306(6). Each STI trench 310(1)-310(4) includes a bottom region 312(1)-312(4) filled with a lower quality oxide 314, and a top region 316(1)-316(4) filled with a higher quality oxide 318.

With continuing reference to FIG. 3, to fill the bottom region 312(1)-312(4) of the corresponding STI trench 310(1)-310(4), the lower quality oxide 314 includes a high aspect ratio oxide configured to fill an area having a height-to-width ratio (i.e., aspect ratio) of greater than ten-to-one (10:1). As non-limiting examples, such high aspect ratio oxides may include spin-on-dielectric oxide (SOD) or flowable chemical vapor deposition (CVD) (FCVD) oxide. Thus, as a Fin pitch P of semiconductor device 300 scales down, causing the aspect ratio of the STI trenches 310(1)-310(4) to increase, the lower quality oxide 314 can more easily fill the bottom regions 312(1)-312(4) compared to a low aspect ratio oxide. As a non-limiting example, assuming that the semiconductor device 300 is fabricated in a ten (10) nanometer (nm) technology, each STI trench 310(1)-310(4) may be approximately twenty-five (25) nm wide, while each Fin 306(1)-306(6) may be approximately ten (10) nm wide, such that the Fin pitch P is approximately thirty-five (35) nm. Additionally, if each Fin 306(1)-306(6) has a height of approximately 150 nm, the corresponding height-to-width aspect ratio of each STI trench 310(1)-310(4) is approximately equal to 6:1 (e.g., 150 nm:25 nm). In this manner, because the lower quality oxide 314 is configured to fill an area having an aspect ratio of greater than ten-to-one (10:1), the lower quality oxide 314 is able to fill the STI trench 310(1)-310(4) with an aspect ratio of six-to-one (6:1).

However, with continuing reference to FIG. 3, additives employed in the lower quality oxide 314, such as hydrogen or nitrogen, make it more susceptible to void formation during particular fabrication steps of the semiconductor device 300. For example, voids 320(1), 320(2) can be formed in the bottom regions 312(1), 312(3) in response to the lower quality oxide 314 shrinking due to annealing. As used herein, the voids 320(1), 320(2) are areas formed within the lower quality oxide 314 that are either a vacuum or filled with gas. As a non-limiting example, the voids 320(1), 320(2) can have a diameter as small as two (2) nm, or as large as the width of the corresponding STI trench 310(1)-310(4).

In contrast, with continuing reference to FIG. 3, the higher quality oxide 318 that fills the top region 316(1)-316(4) of the corresponding STI trench 310(1)-310(4) does not include additives so as to not be susceptible to void formation. For example, the higher quality oxide 318 may include silicon oxide without any additives such that voids are not formed in response to annealing. Without such additives, the higher quality oxide 318 is a low aspect ratio oxide configured to fill an area having a height-to-width ratio (i.e., aspect ratio) of less than ten-to-one (10:1). Thus, the higher quality oxide 318 is designed to fill each top region 316(1)-316(4) without forming voids, while also filling voids formed in the bottom regions 312(1)-312(4) and adjacent to the corresponding top region 316(1)-316(4). For example, the higher quality oxide 318 fills the top region 316(1) and also fills the void 320(1) of the bottom region 312(1).

With continuing reference to FIG. 3, the first FinFET 302(1) employs a gate 322(1) formed with a conductive material disposed over the channel structures 306(1)-306(3) and the STI trenches 310(1), 310(2). The first FinFET 302(1) also employs a source (not shown) disposed on a first side of the channel structures 306(1)-306(3) and the STI trenches 310(1), 310(2), and a drain (not shown) disposed on a second side of the channel structures 306(1)-306(3) and the STI trenches 310(3), 310(4) opposite of the first side. In this manner, as previously described, because the void 320(1) is adjacent to the top region 316(1) in the STI trench 310(1), the higher quality oxide 318 of the top region 316(1) fills the void 320(1). Thus, the top region 316(1) prevents the conductive material of the gate 322(1) from filling the void 320(1). The second FinFET 302(2) similarly employs a gate 322(2) formed with a conductive material, a source (not shown), and a drain (not shown). However, the void 320(2) is not adjacent to the top region 316(3) of the STI trench 310(3). In this manner, the void 320(2) is not susceptible to being filled by the conductive material of the gate 322(2), and thus is not filled by the higher quality oxide 318. By preventing the conductive material of the gate 322(1) from filling the void 320(1), the top region 316(1) electrically isolates the gate 322(1) from the source and drain of the first FinFET 302(1). Additionally, because the higher quality oxide 318 is not susceptible to forming voids, the higher quality oxide 318 of the top regions 316(1)-316(4) does not include voids with which the gates 322(1), 322(2) may electrically couple the corresponding source and drain. In this manner, filling the top region 316(1)-316(4) of each STI trench 310(1)-310(4) with the higher quality oxide 318 prevents STI void-induced electrical shorts in the semiconductor device 300.

Figure 4:
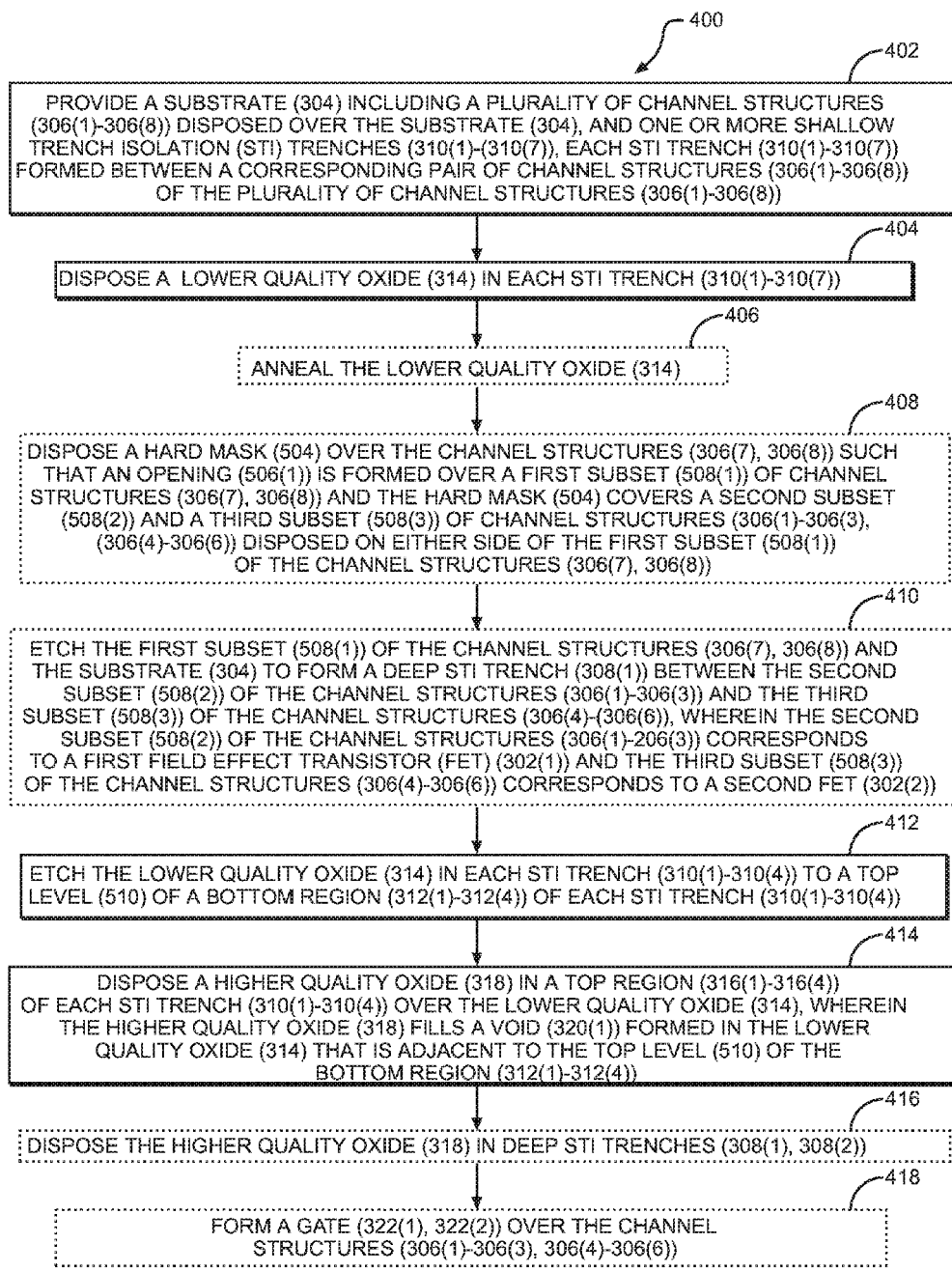
FIG. 4 is a flowchart illustrating an exemplary process for fabricating the semiconductor device in FIG. 3 without STI void-induced electrical shorts.

FIG. 4 illustrates exemplary process 400 for fabricating the semiconductor device 300 in FIG. 3 without STI void-induced electrical shorts. Further, FIGS. 5A-5F provide cross-sectional diagrams illustrating the semiconductor device 300 during the various steps of the fabrication process 400. The cross-sectional diagrams illustrating the semiconductor device 300 in FIGS. 5A-5F will be discussed in conjunction with the discussion of the exemplary fabrication steps in the fabrication process 400 in FIG. 4.

Figure 5A:
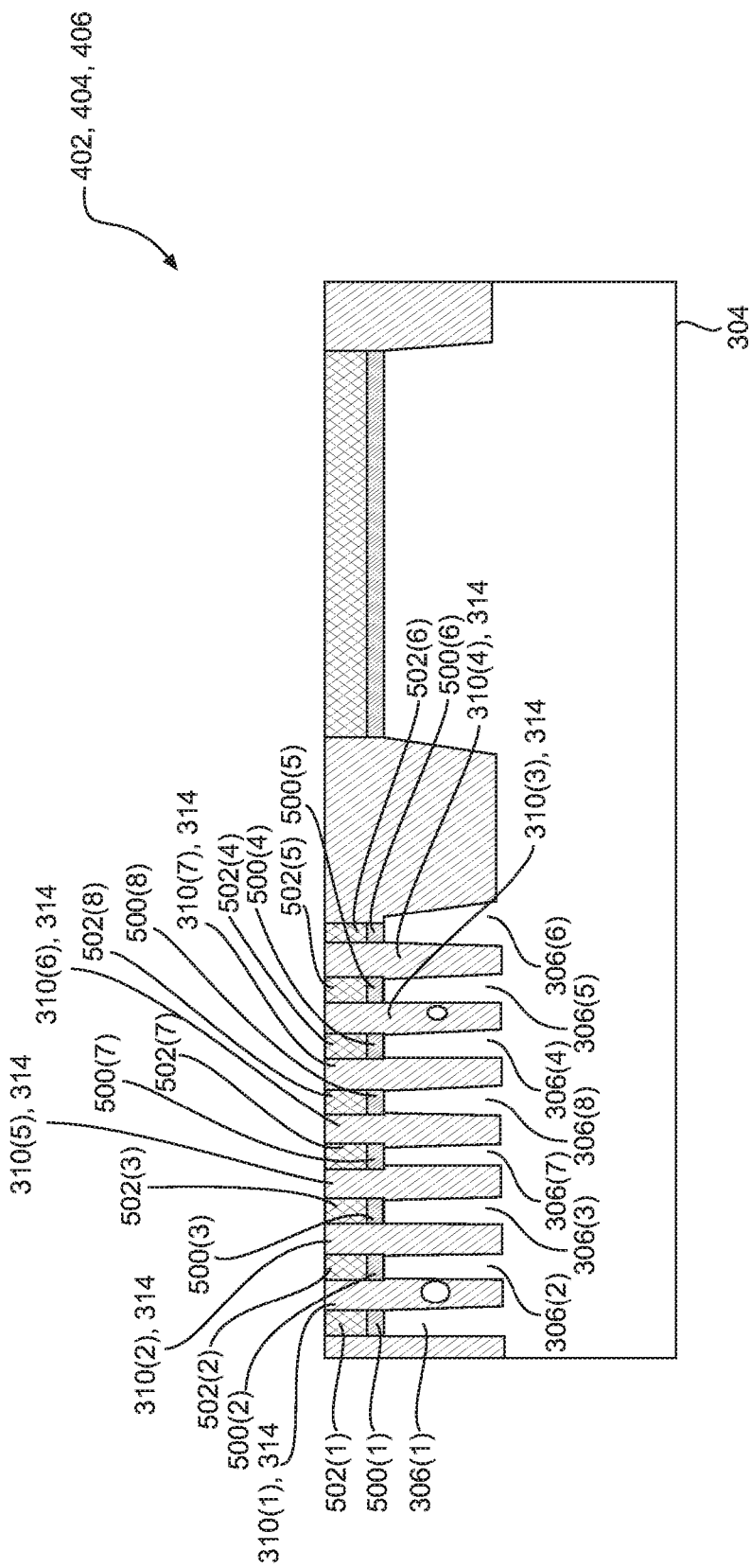

In this regard, the fabrication process 400 includes providing the substrate 304 that includes channel structures 306(1)-306(8) disposed over the substrate 304, and STI trenches 310(1)-310(7) (block 402, FIG. 5A). In this aspect, each STI trench 310(1)-310(7) is formed between a corresponding pair of channel structures 306(1)-306(8). Additionally, in this aspect, a pad oxide 500(1)-500(8) is disposed over each channel structure 306(1)-306(8), and a nitride hard mask 502(1)-502(8) is disposed over each pad oxide 500(1)-500(8). In this manner, each pad oxide 500(1)-500(8) and each nitride hard mask 502(1)-502(8) protect the corresponding channel structures 306(1)-306(8) from damage during the fabrication process 400. The fabrication process 400 also includes disposing the lower quality oxide 314 in each STI trench 310(1)-310(7) (block 404, FIG. 5A). The fabrication process 400 can also include annealing the lower quality oxide 314 (block 406, FIG. 5A). For example, a first anneal with a temperature between approximately 450 Celsius (C) and 700 C may be performed, followed by a second anneal with a temperature between approximately 850 C and 1100 C. As previously described, annealing the lower quality oxide 314 in block 406 can cause the lower quality oxide 314 to shrink, thus causing the void 320(1).

Figure 5B:
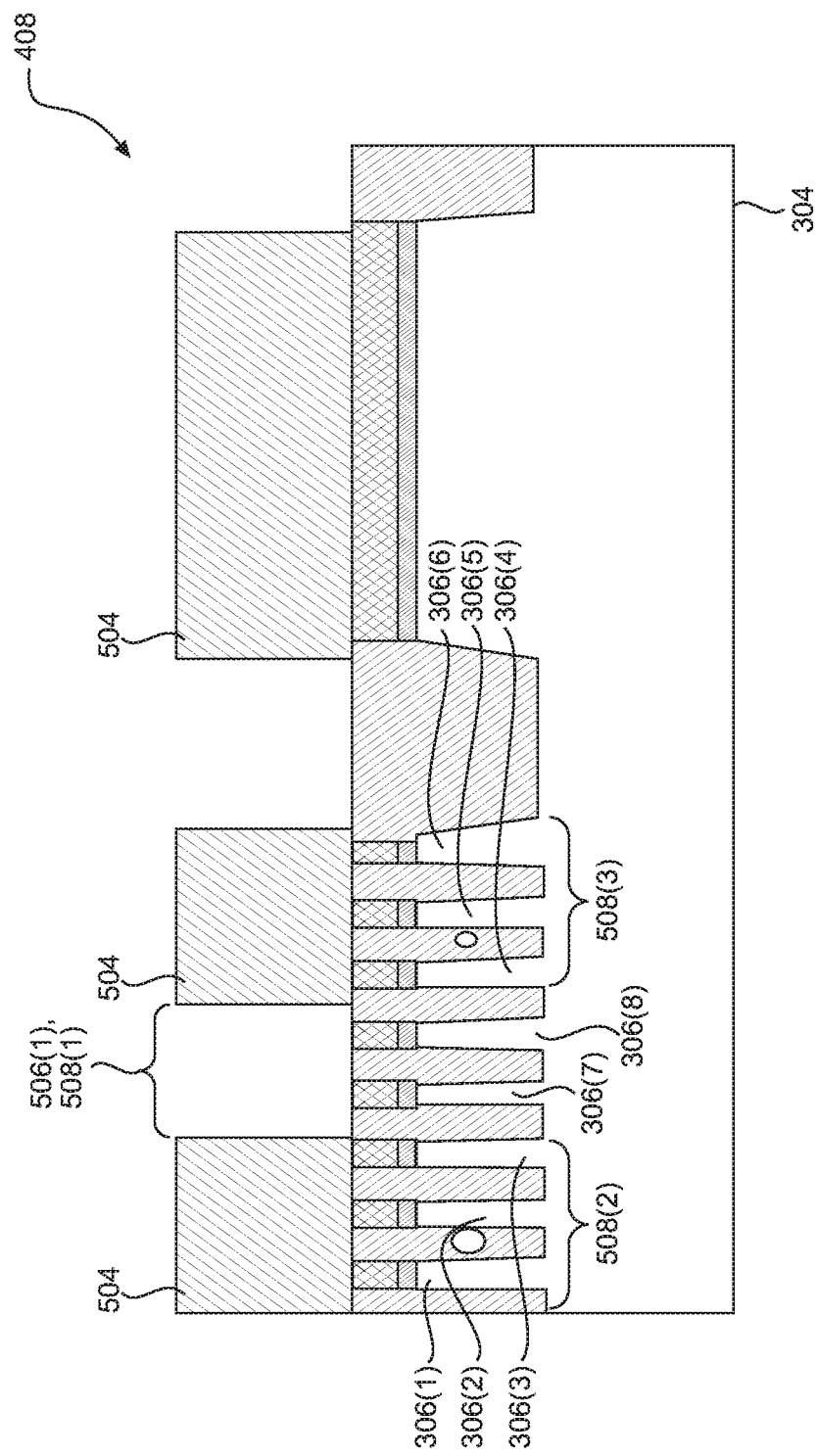

With continuing reference to FIG. 4, so as to form more than the first and second FinFETs 302(1), 302(2) in the semiconductor device 300, the fabrication process 400 can also include disposing a hard mask 504 over the channel structures 306(7)-306(8) such that an opening 506(1) is formed over a first subset 508(1) of channel structures 306(7), 306(8) (block 408, FIG. 5B). In this manner, the hard mask 504 covers a second subset 508(2) and a third subset 508(3) of channel structures 306(1)-306(3), 306(4)-306(6) disposed on either side of the first subset 508(1) of channel structures 306(7), 306(8). The fabrication process 400 can also include etching the first subset 508(1) of the channel structures 306(7), 306(8) and the substrate 304 to form the deep STI trench 308(1) between the second subset 508(2) of the channel structures 306(1)-306(3) and the third subset 508(3) of the channel structures 306(4)-306(6) (block 410, FIG. 5C). In this manner, the second subset 508(2) of the channel structures 306(1)-306(3) corresponds to the first FinFET 302(1), and the third subset 508(3) of the channel structures 306(4)-306(6) corresponds to the second FinFET 302(2). Additionally, in this aspect, the hard mask 504 also includes an opening 506(2) such that the deep STI trench 308(2) is formed to electrically isolate the second FinFET 302(2) from other elements in the semiconductor device 300.

With continuing reference to FIG. 4, the fabrication process 400 also includes etching the lower quality oxide 314 in each STI trench 310(1)-310(4) to a top level 510 of the bottom region 312(1)-312(4) of each STI trench 310(1)-310(4) (block 412, FIG. 5D). Further, the fabrication process 400 includes disposing the higher quality oxide 318 in the top region 316(1)-316(4) of each STI trench 310(1)-310(4) over the lower quality oxide 314 (block 414, FIG. 5E). In addition to filling the STI trenches 310(1)-310(4), the higher quality oxide 318 fills the void 320(1) formed in the lower quality oxide 314 that is adjacent to the top level 510 of the bottom region 312(1). In this aspect, the fabrication process 400 can also include disposing the higher quality oxide 318 in the deep STI trenches 308(1), 308(2) (block 416, FIG. 5E). Disposing the higher quality oxide 318 in block 416 can achieved using a conventional high aspect ratio process (HARP). To complete the first and second FinFETs 302(1), 302(2), the fabrication process 400 can include forming the gates 322(1), 322(2) over the channel structures 306(1)-306(3), 306(4)-306(6), respectively (block 418, FIG. 5F). To form the gates 322(1), 322(2) in this aspect, the pad oxides 500(1)-500(3), 500(4)-500(6) and the nitride hard masks 502(1)-502(3), 502(4)-502(6) are first removed. Additionally, the gates 322(1), 322(2) can be formed using conventional fabrication techniques, such as high dielectric metal gate (HKMG) processes. An interlayer dielectric (ILD) can also be disposed so as to fill in gaps in the semiconductor device 300. As previously described, filling the void 320(1) with the higher quality oxide 318 such that the void 320(1) electrically isolates the gate 322(1) from the void 320(1) prevents an STI void-induced electrical short in the semiconductor device 300.

Figure 6:
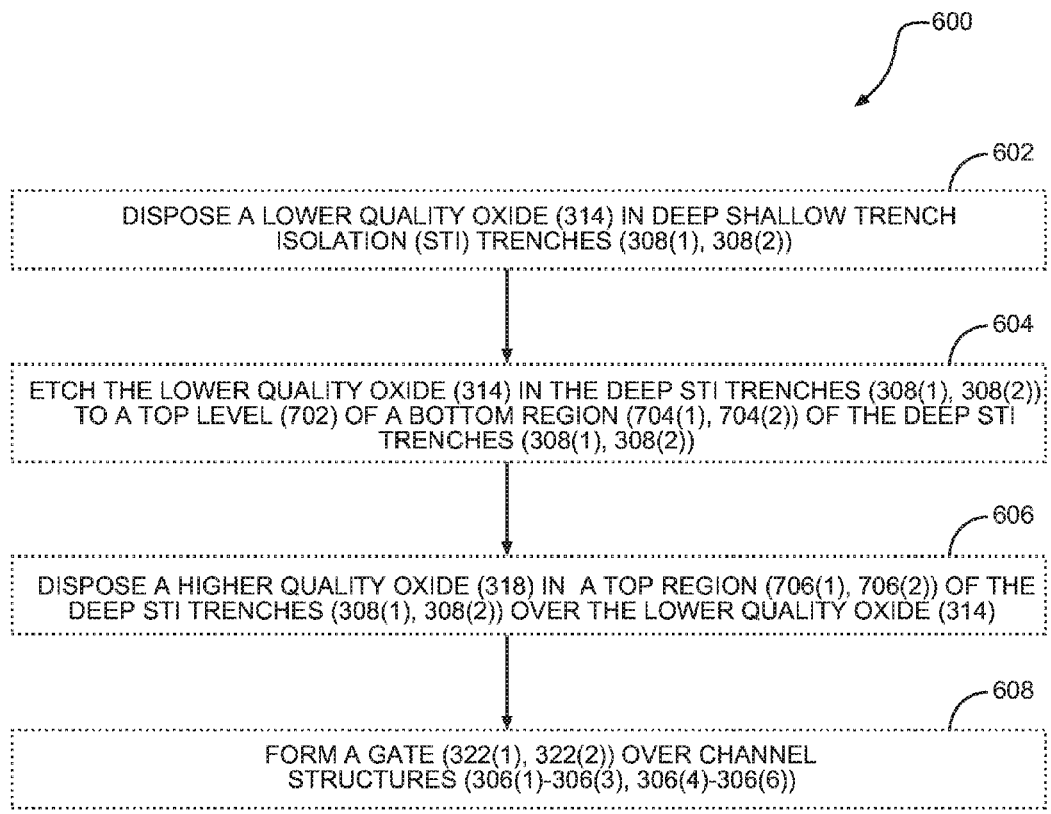
FIG. 6 is a flowchart illustrating exemplary process for fabricating a semiconductor device without STI void-induced electrical shorts, wherein a deep STI trench electrically isolating multiple FinFETs is filled with lower and higher quality oxides.
Figure 7C:
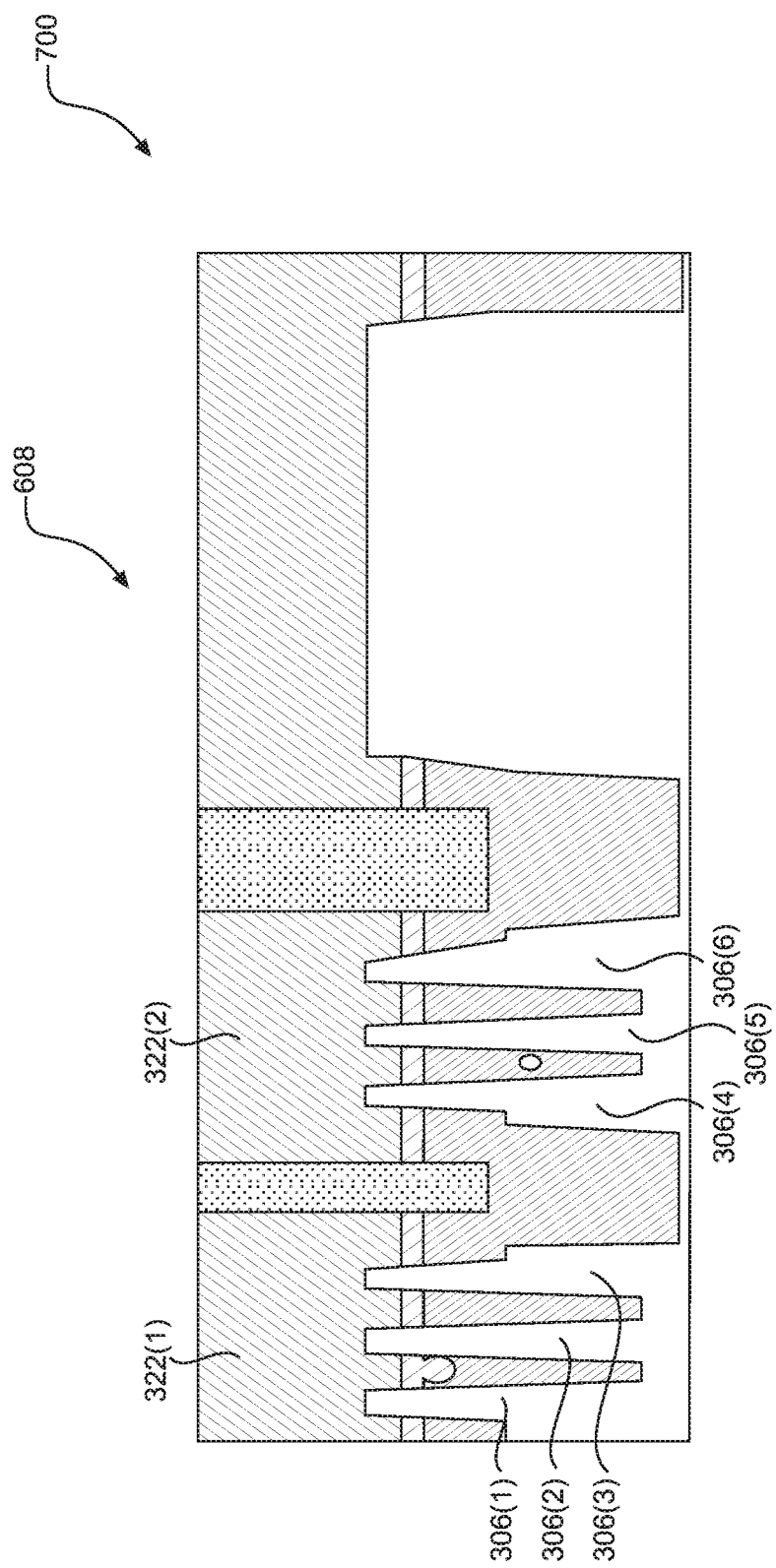

In addition to disposing the higher quality oxide 318 in the deep STI trenches 308(1), 308(1) as in the semiconductor device 300 in FIG. 3, other aspects can employ both the lower quality and higher quality oxides 314, 318 in the deep STI trenches 308(1), 308(2). In this regard, FIG. 6 illustrates an exemplary fabrication process 600 that can be substituted for blocks 416, 418 in FIG. 4 such that the lower quality and higher quality oxides 314, 318 are disposed in the deep STI trenches 308(1), 308(2). Further, FIGS. 7A-7C provide cross-sectional diagrams illustrating a semiconductor device 700 during the various steps of the fabrication process 600. The cross-sectional diagrams illustrating the semiconductor device 700 in FIGS. 7A-7C will be discussed in conjunction with the discussion of the exemplary fabrication steps in the fabrication process 600 in FIG. 6.

In this regard, the fabrication process 600 includes disposing the lower quality oxide 314 in the deep STI trenches 308(1), 308(2) (block 602, FIG. 7A). The fabrication process 600 also includes etching the lower quality oxide 314 in the deep STI trenches 308(1), 308(2) to a top level 702 of a bottom region 704(1), 704(2) of each deep STI trench 308(1), 308(2) (block 604, FIG. 7A). Additionally, the fabrication process 600 includes disposing the higher quality oxide 318 in a top region 706(1), 706(2) of each deep STI trench 308(1), 308(2) over the lower quality oxide 314 (block 606, FIG. 7B). Similar to the fabrication process 400 in FIG. 4, the fabrication process 600 can also include forming the gate 322(1), 322(2) over the channel structures 306(1)-306(3), 306(4)-306(6), respectively (block 608, FIG. 7C). Forming the semiconductor device 700 with the lower quality and higher quality oxides 314, 318 in the deep STI trenches 308(1), 308(2) in this manner may reduce the fabrication costs, as less of the higher quality oxide 318 is used compared to the semiconductor device 300 in FIG. 3.

Figure 8:
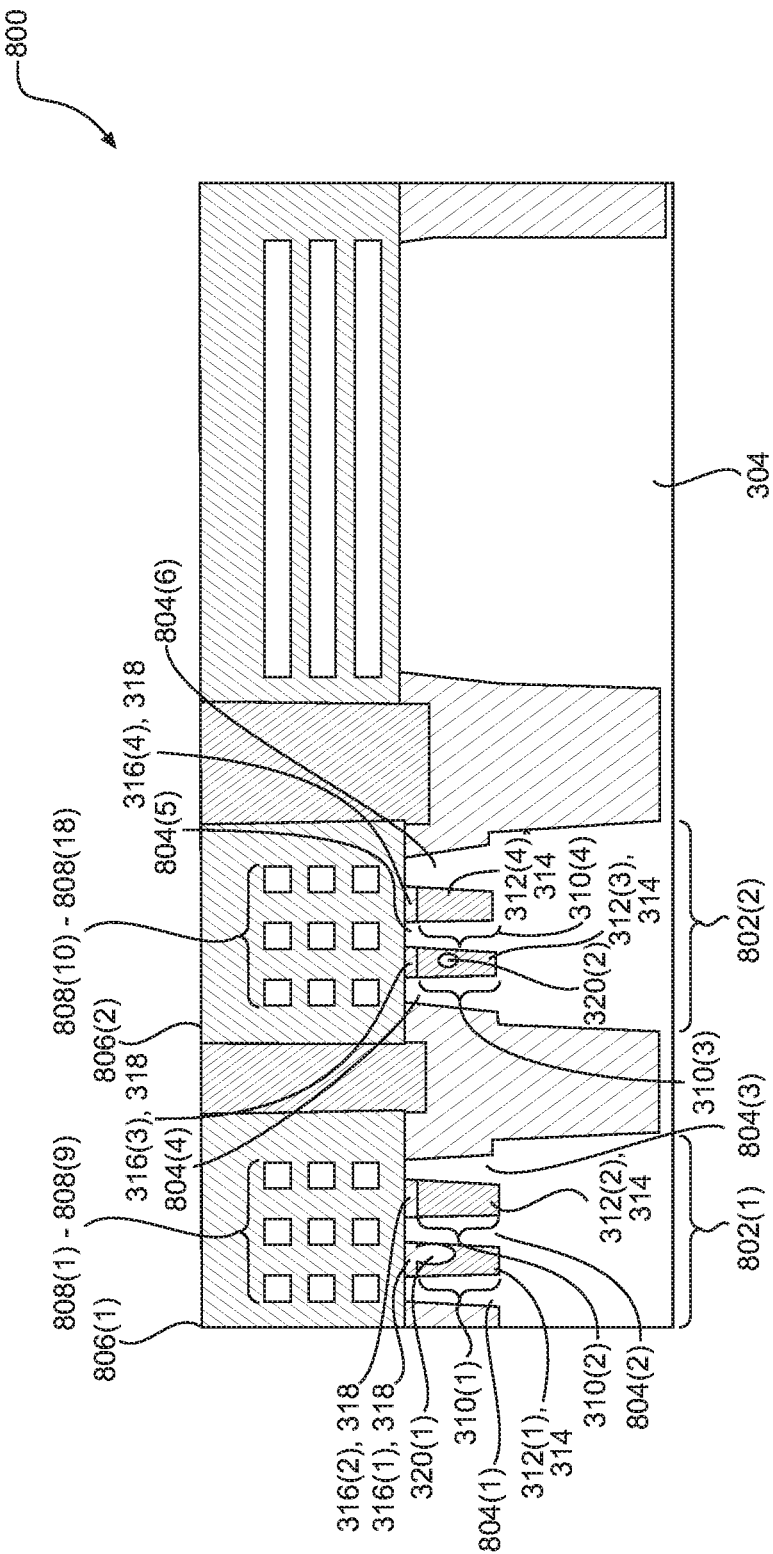
FIG. 8 is a cross-sectional view of an exemplary semiconductor device employing nanowire FETs without STI void-induced electrical shorts.

In addition to filling the STI trenches 310(1)-310(4) with the lower quality and higher quality oxides 314, 318 in the semiconductor device 300 employing the first and second FinFETs 302(1), 302(2) in FIG. 3, other aspects may employ alternative FET types while still preventing STI void-induced electrical shorts. In this regard, FIG. 8 illustrates a cross-sectional view of an exemplary semiconductor device 800 employing first and second nanowire FETs 802(1), 802(2) without STI void-induced electrical shorts. The semiconductor device 800 includes certain common components with the semiconductor device 300 in FIG. 3, as shown by similar element numbers between FIGS. 3 and 8, and thus will not be re-described herein. In this manner, the first nanowire FET 802(1) employs corresponding channel structures 804(1)-804(3) disposed over the substrate 304. Additionally, the second nanowire FET 802(2) employs corresponding channel structures 804(4)-804(6) disposed over the substrate 304.

With continuing reference to FIG. 8, the semiconductor device 800 also includes STI trenches 310(1)-310(4) formed between each corresponding pair of channel structures 804(1)-804(6). In particular, with reference to the first nanowire FET 802(1), the STI trench 310(1) is formed between the channel structures 804(1), 804(2), and the STI trench 310(2) is formed between the channel structures 804(2), 804(3). Additionally, with reference to the second nanowire FET 802(2), the STI trench 310(3) is formed between the channel structures 804(4), 804(5), and the STI trench 310(4) is formed between the channel structures 804(5), 804(6). Further, the first nanowire FET 802(1) employs a gate 806(1) disposed over the channel structures 804(1)-804(3) and the STI trenches 310(1), 310(2). The gate 806(1) is formed by employing nanowires 808(1)-808(9) surrounded by a conductive material. The second nanowire FET 802(2) similarly employs a gate 806(2) disposed over the channel structures 804(4)-804(6) and the STI trenches 310(3), 310(4). The gate 806(2) is formed by employing nanowires 808(10)-808(18) surrounded by a conductive material.

With continuing reference to FIG. 8, as described with reference to FIG. 3, each STI trench 310(1)-310(4) in the semiconductor device 800 includes the corresponding bottom region 312(1)-312(4) filled with the lower quality oxide 314, and the corresponding top region 316(1)-316(4) filled with the higher quality oxide 318. In this manner, the higher quality oxide 318 in the top region 316(1) fills a void 320(1)

such that the gate 806(1) does not create an STI void-induced electrical short. Thus, similar to the semiconductor device 300 in FIG. 3, filling the top region 316(1)-316(4) of each STI trench 310(1)-310(4) with the higher quality oxide 318 prevents STI void-induced electrical shorts in the semiconductor device 800.

The elements described herein are sometimes referred to as means for achieving a particular property. In this regard, the substrate 304 is sometimes referred to herein as "a means for providing a substrate." The channel structures 306(1)-306(6) and 804(1)-804(6) are sometimes referred to herein as "a means for providing a plurality of channel structures disposed over the substrate and corresponding to a FET." Further, the STI trenches 310(1)-310(4) are sometimes referred to herein as "a means for providing one or more STI trenches."

Additionally, while the aspects provided herein include semiconductor devices with multiple FETs, such as the first and second FinFETs 302(1), 302(2), other aspects may include a semiconductor device with a single FET. As a non-limiting example, a semiconductor device may employ a single FET with multiple channel structures, and an STI trench filled with lower and higher quality oxides between each channel structure, as described above.

The semiconductor devices employing FETs with multiple channel structures without STI void-induced electrical shorts according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 9:
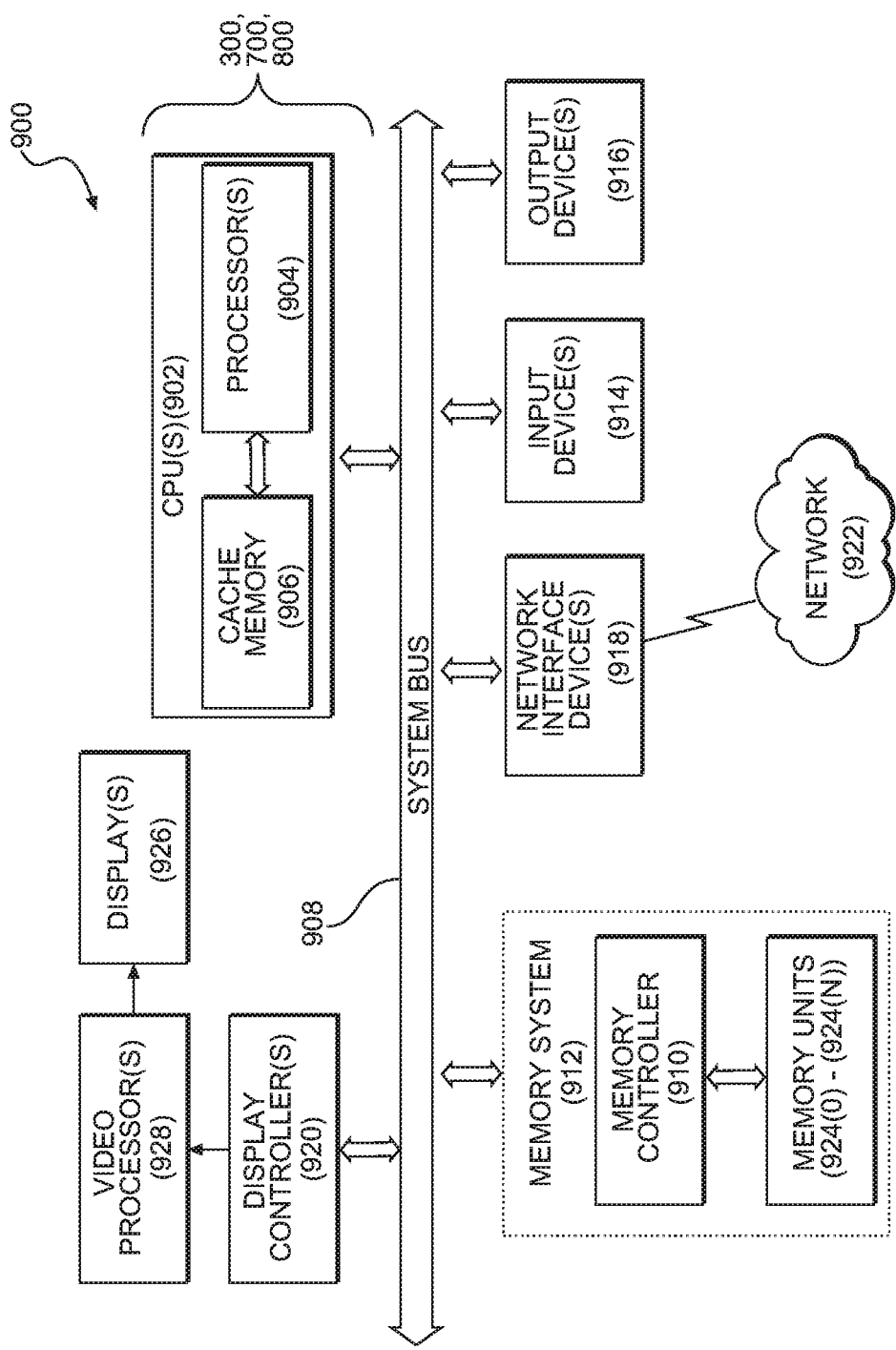
FIG. 9 is a block diagram of an exemplary processor-based system that can include the semiconductor devices of FIGS. 3, 7C, and 8.

In this regard, FIG. 9 illustrates an example of a processor-based system 900 that can employ semiconductor devices 300, 700, and 800 illustrated in FIGS. 3, 7C, and 8, respectively. In this example, the processor-based system 900 includes one or more central processing units (CPUs) 902, each including one or more processors 904. The CPU(s) 902 may have cache memory 906 coupled to the processor(s) 904 for rapid access to temporarily stored data. The CPU(s) 902 is coupled to a system bus 908 and can intercouple master and slave devices included in the processor-based system 900. As is well known, the CPU(s) 902 communicates with these other devices by exchanging address, control, and data information over the system bus 908. For example, the CPU(s) 902 can communicate bus transaction requests to a memory controller 910 as an example of a slave device. Although not illustrated in FIG. 9, multiple system buses 908 could be provided, wherein each system bus 908 constitutes a different fabric.

Other master and slave devices can be connected to the system bus 908. As illustrated in FIG. 9, these devices can include a memory system 912, one or more input devices 914, one or more output devices 916, one or more network interface devices 918, and one or more display controllers 920, as examples. The input device(s) 914 can include any type of input device, including, but not limited to, input keys, switches, voice processors, etc. The output device(s) 916 can include any type of output device, including, but not limited to, audio, video, other visual indicators, etc. The network interface device(s) 918 can be any device configured to allow exchange of data to and from a network 922. The network 922 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 918 can be configured to support any type of communications protocol desired. The memory system 912 can include one or more memory units 924(0)-924(N).

The CPU(s) 902 may also be configured to access the display controller(s) 920 over the system bus 908 to control information sent to one or more displays 926. The display controller(s) 920 sends information to the display(s) 926 to be displayed via one or more video processors 928, which process the information to be displayed into a format suitable for the display(s) 926. The display(s) 926 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A semiconductor device, comprising:
   a substrate;
   a plurality of channel structures disposed over the substrate, the plurality of channel structures of a first field effect transistor (FET);
   one or more shallow trench isolation (STI) trenches, each STI trench formed between a corresponding pair of channel structures of the plurality of channel structures and comprising:
      a bottom region filled with a lower quality oxide; and
      a top region formed above the bottom region and filled with a higher quality oxide;
   a gate of the first FET disposed over the plurality of channel structures and the top region of each STI trench of the one or more STI trenches;
   a source of the first FET disposed on a first side the plurality of channel structures and the one or more STI trenches; and
   a drain of the first FET disposed on a second side of the plurality of channel structures and the one or more STI trenches opposite of the first side,
   wherein the top region of each STI trench of the one or more STI trenches is filled with the higher quality oxide such that a void is not formed in the top region, and
   wherein the top region of each STI trench of the one or more STI trenches electrically isolates the gate from the source and the drain.

2. The semiconductor device of claim 1, wherein the lower quality oxide comprises a high aspect ratio oxide configured to fill an area having a height to width ratio of greater than ten-to-one (10:1).

3. The semiconductor device of claim 2, wherein the higher quality oxide comprises a low aspect ratio oxide configured to fill an area having a height to width ratio of less than ten-to-one (10:1).

4. The semiconductor device of claim 3, wherein the lower quality oxide is selected from the group consisting of: spin-on-dielectric oxide (SOD); and flowable chemical vapor deposition (CVD) (FCVD) oxide.

5. The semiconductor device of claim 4, wherein the higher quality oxide comprises silicon oxide.

6. The semiconductor device of claim 1, wherein:
   each channel structure of the plurality of channel structures comprises a Fin; and
   the first FET comprises a FinFET.

7. The semiconductor device of claim 1, wherein the first FET comprises a nanowire FET.

8. The semiconductor device of claim 1 integrated into an integrated circuit (IC).

9. The semiconductor device of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

10. A semiconductor device, comprising:
    a substrate;
    a plurality of channel structures disposed over the substrate, the plurality of channel structures of a first field effect transistor (FET);
    one or more shallow trench isolation (STI) trenches, each STI trench formed between a corresponding pair of channel structures of the plurality of channel structures and comprising:
       a bottom region filled with a lower quality oxide; and
       a top region formed above the bottom region and filled with a higher quality oxide;
    a gate of the first FET disposed over the plurality of channel structures and the top region of each STI trench of the one or more STI trenches;
    a source of the first FET disposed on a first side of the plurality of channel structures and the one or more STI trenches;
    a drain of the first FET disposed on a second side of the plurality of channel structures and the one or more STI trenches opposite of the first side;
    a second plurality of channel structures disposed over the substrate, the second plurality of channel structures of a second FET;
    one or more STI trenches, each STI trench formed between a corresponding pair of channel structures of the second plurality of channel structures of the second FET and comprising:
       a bottom region filled with the lower quality oxide; and
       a top region formed above the bottom region and filled with the higher quality oxide; and
    a deep STI trench formed between the first FET and the second FET and configured to electrically isolate the first FET and the second FET.

11. The semiconductor device of claim 10, wherein the deep STI trench is filled with the higher quality oxide.

12. The semiconductor device of claim 10, wherein the deep STI trench comprises:
   a bottom region filled with the lower quality oxide; and
   a top region filled with the higher quality oxide.

13. A method for manufacturing semiconductor devices employing Field Effect Transistors (FETs) with multiple channel structures without shallow trench isolation (STI) void-induced electrical shorts, comprising:
   providing a substrate comprising a plurality of channel structures of a first field effect transistor (FET) disposed over the substrate, and one or more STI trenches, each STI trench formed between a corresponding pair of channel structures of the plurality of channel structures;
   disposing a lower quality oxide in a bottom region of each STI trench;
   disposing a higher quality oxide in a top region of each STI trench above the bottom region, wherein the higher quality oxide fills voids formed in the lower quality oxide that are adjacent to the top region;
   disposing a gate of the first FET over the plurality of channel structures and the top region of each STI trench of the one or more STI trenches;
   disposing a source of the first FET on a first side the plurality of channel structures and the one or more STI trenches;
   disposing a drain of the first FET on a second side of the plurality of channel structures and the one or more STI trenches opposite of the first side,
   disposing a hard mask over the plurality of channel structures such that an opening is formed over a first subset of channel structures and the hard mask covers a second subset of channel structures and a third subset of channel structures disposed on either side of the first subset of channel structures; and
   etching the first subset of channel structures and the substrate to form a deep STI trench between the second subset of channel structures and the third subset of channel structures, wherein the second subset of channel structures are of the first FET and the third subset of channel structures are of a second FET.

14. The method of claim 13, further comprising disposing the higher quality oxide in the deep STI trench.

15. The method of claim 13, further comprising:
   disposing the lower quality oxide in the deep STI trench;
   etching the lower quality oxide in the deep STI trench to a top level of a bottom region of the deep STI trench; and
   disposing the higher quality oxide in a top region of the deep STI trench over the lower quality oxide.

16. The method of claim 13, further comprising annealing the lower quality oxide.

17. The method of claim 13, wherein disposing the lower quality oxide comprises disposing a high aspect ratio oxide configured to fill an area having a height to width ratio of greater than ten-to-one (10:1).

18. The method of claim 17, wherein disposing the higher quality oxide comprises disposing a low aspect ratio oxide configured to fill an area having a height to width ratio of less than ten-to-one (10:1).

19. The method of claim 13, further comprising etching the lower quality oxide in each STI trench to a top level of the bottom region of each STI trench.

* * * * *